United States Patent [19]
Murayama et al.

[11] Patent Number: 4,803,706
[45] Date of Patent: Feb. 7, 1989

[54] VARIABLE DELAY CHARGE COUPLED DEVICE

[75] Inventors: Jin Murayama; Takashi Miida; Ryuji Kondo, all of Kanagawa, Japan

[73] Assignee: Fuji Photo Film Co., Ltd., Kanagawa, Japan

[21] Appl. No.: 71,682

[22] Filed: Jul. 9, 1987

[30] Foreign Application Priority Data

Jul. 9, 1986 [JP] Japan ................................ 61-159546

[51] Int. Cl.⁴ ...................... G11C 19/28; H01L 29/78
[52] U.S. Cl. ........................................ 377/63; 377/60; 377/61; 357/24
[58] Field of Search ........................ 377/58, 60, 61, 62, 377/63, 74, 79, 81; 357/24, 24 M; 358/213.18, 213.26, 213.29, 213.31

[56] References Cited

U.S. PATENT DOCUMENTS

| 3,819,954 | 6/1974 | Butler et al. | 377/79 |
| 3,944,850 | 3/1976 | Walden | 357/24 |
| 3,955,100 | 5/1976 | Takahashi et al. | 377/60 |
| 3,989,956 | 11/1976 | Walden | 377/60 |
| 4,001,861 | 1/1977 | Carnes | 357/24 LR |
| 4,080,581 | 3/1978 | Sakave et al. | 357/24 |
| 4,159,430 | 6/1979 | Boudewijins et al. | 377/63 |
| 4,234,807 | 11/1980 | Esser et al. | 307/304 |
| 4,255,725 | 3/1981 | Berger et al. | 377/58 |
| 4,262,217 | 4/1981 | Levine | 377/62 |
| 4,266,146 | 5/1981 | Van Roermund | 357/24 |
| 4,280,066 | 7/1981 | Engeler et al. | 377/60 |
| 4,315,164 | 2/1982 | Kub et al. | 377/62 |
| 4,546,368 | 10/1985 | Yamanari | 377/60 |
| 4,661,788 | 4/1987 | Levine | 377/60 |

Primary Examiner—Stanley D. Miller
Assistant Examiner—Tai van Duong
Attorney, Agent, or Firm—Sughrue, Mion, Zinn, Macpeak & Seas

[57] ABSTRACT

A various CCD delay element in which extra delay stages are provided. The extra stages are either held at a given potential to pass all signals therethrough and thus to not contribute to the gain or are connected to the clock signals to thereby increase the delay.

4 Claims, 3 Drawing Sheets

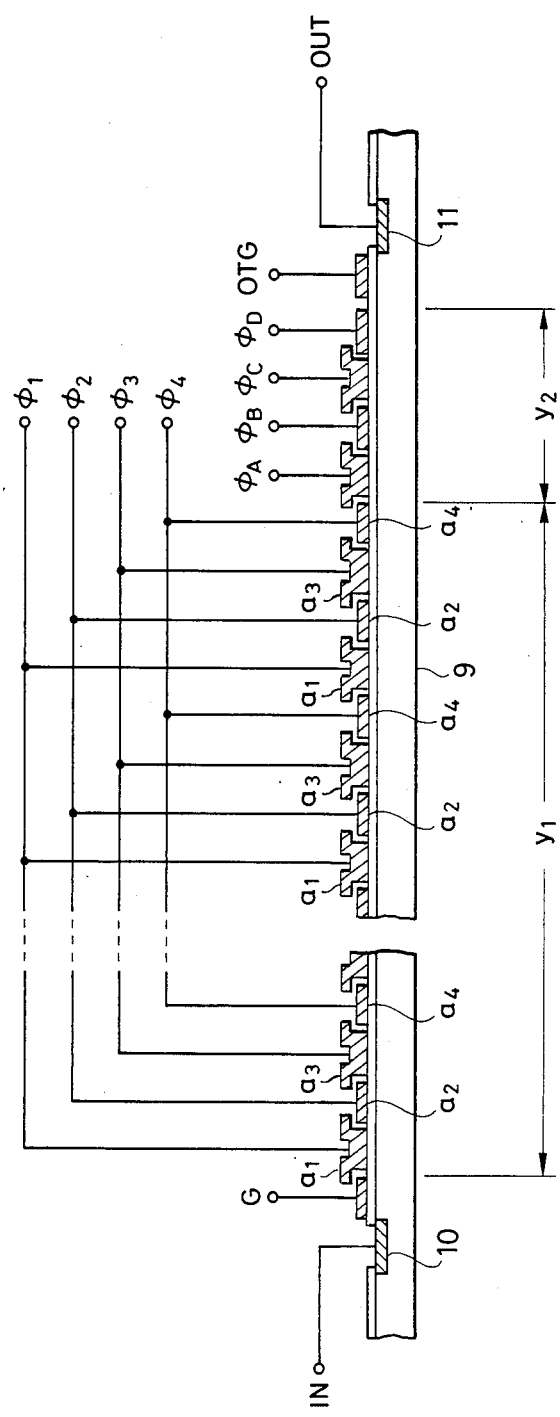

VARIABLE DELAY CHARGE COUPLED DEVICE

BACKGROUND OF THE INVENTION

1. Field of the Invention

The present invention relates to a delay element employing a charge coupled device.

2. Background of the Invention

Delay elements using charge coupled devices (called a CCD delay element herein) are often used in color signal processing circuits for color video cameras.

In a color signal separation circuit for a signal carrier frequency separation system, for instance, red (R) and blue (B) signals are produced in the following manner. A color signal produced one horizontal scanning period before is added to or subtracted form what is produced by a color pickup element. A CCD delay element is employed to delay the color signal output by the one horizontal scanning period so as to implement the aforesaid processing.

FIG. 1 is a vertical sectional view showing the principal part of a conventional two-phase clock transfer type CCD delay element by way of example.

In FIG. 1, there is show a two-phase clock transfer type CCD delay element. A unit cell A is constituted by pair of transfer gate electrodes formed on the surface of a $p^-$-type silicon substrate 1 and by $P^{+-}$-type transfer barriers 2 formed beneath one of the transfer gate electrodes. One unit cell A receiving a clock signal $\phi_1$ and another unit cell receiving another clock signal $\phi_2$ are wired so that they are disposed alternately in the transfer direction. In addition, there are formed an input diode 3 and an output diode 4 composed of P+ regions. The input diode 3 is separated by input gates $G_1$ and $G_2$ from the input terminal of a group of unit cells A disposed in the transfer direction. Correspondingly, the output diode 4 is separated by an output gate OTG from the output terminal of the unit cell group. The input diode 3 is connected to an input terminal IN and the output diode 4 to an output terminal OUT.

FIG. 2 is a waveform chart showing the two-phase clock signals $\phi_1$ and $\phi_2$, whereas FIG. 3 is a graphic illustration of potential profiles of a potential well produced by the two-phase clock signals $\phi_1$ and $\phi_2$ at three points of time $t_1$, $t_2$ and $t_3$. When a signal being delayed is supplied to the input terminal IN while the input gates $G_1$ and $G_2$ and the output gate OTG are held on, the potential well produced in each unit cell is allowed to provide transfer operation across the output terminal OUT as show in FIG. 3. An output signal is produced by the output terminal OUT after the lapse of the delay time determined by the number of series unit cells A disposed in the transfer direction and the periods of the two-phase clock signals $\phi_1$ and $\phi_2$.

The period of a transfer clock signal must be changed to effect the adjustment of delay time because the number of unit cells A is unchangeable once they have been manufactured according to standard semiconductor IC technology as far as the conventional CCD delay elements are concerned. In consideration of the accuracy required, however, it is difficult to the adjust delay time so minutely as to regulate the oscillation circuit for producing the transfer clock signals.

SUMMARY OF THE INVENTION

An object of the present invention is to provide, in view of the aforesaid problems, a CCD delay element capable of facilitating the adjustment of delay time.

In order to technically accomplish the aforesaid object, the present invention is designed to provide at least one series connected additional unit cell for use as an adjusting stage in a proper position where a group of unit cells are formed in the transfer direction. The delay time is lengthened by applying a transfer signal to the adjusting stage so as to make the adjusting stage perform transfer operation, whereas the transfer gate electrode of the adjusting stage is locked up at a given potential to provide a channel for use as the current path of signal charges unaffected by the transfer clock signal, i.e., without causing the generation of delay time, to shorten the delay time, whereby an increase and decrease in the delay time can be adjusted.

BRIEF DESCRIPTION OF THE DRAWINGS

FIG. 5 is a vertical section a view showing the principal part of another delay element embodying the present invention.

DETAILED DESCRIPTION OF THE INVENTION

Figure 4:
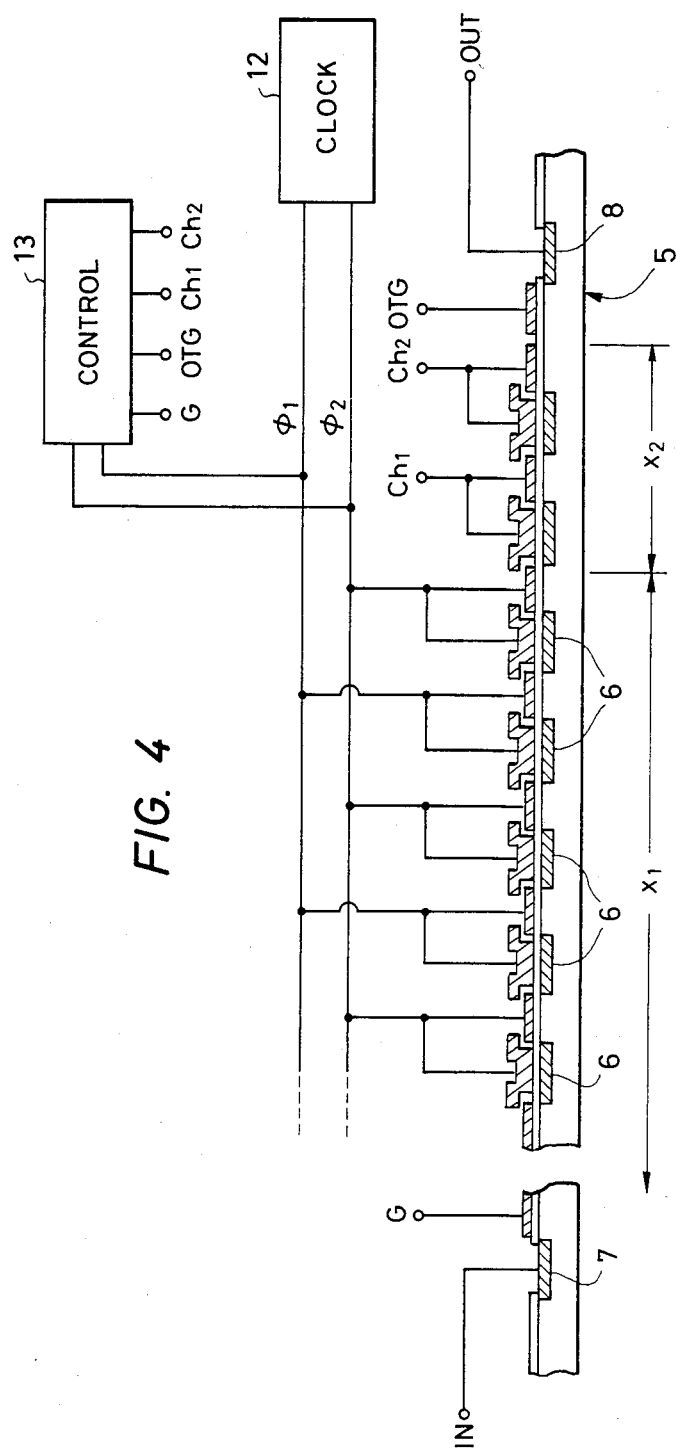
FIG. 4 is a vertical sectional view showing the principal part of a delay element embodying the present invention.

FIG. 4 is a vertical sectional view showing the principal part of a delay element embodying the present invention.

In FIG. 4, there is shown a two-phase clock transfer type CCD delay element, wherein a unit cell is composed of a pair of transfer gate electrodes formed on the surface of a $P^-$-type silicon substrate 5 and $P^{+-}$-type transfer barriers 6 formed beneath one of the transfer gate electrodes. A predetermined number of series unit cells are disposed in the transfer direction to form a delay stage $x_1$. One group of unit cells receive a clock signal $\phi_1$ from a clock oscillator 12 and another group of unit cells receive a clock signal $\phi_2$. The two groups of unit cells are wired so that they are disposed alternately in the transfer direction. Moreover, there are formed sufficient stages of unit cells to obtain a reference delay time $Td_1$.

In addition to the delay stage $x_1$, two series unit cells having a configuration similar to that of the unit cells of the delay stage $x_1$ are formed and constitute an adjusting stage $x_2$.

An input diode 7 and an outptut diode 8, which are composed of a P+-type region, are formed at the ends of the delay stage $x_1$ and of the adjusting stage $x_2$. The input and output diodes 7 and 8 are separated from the unit cells by input gate G and an output gate OTG, respectively. The diode 7 is connected to an input terminal IN and the diode 8 to an output terminal OUT.

Figure 1:
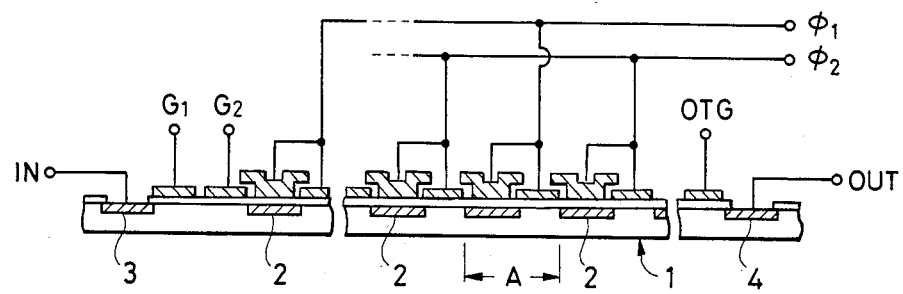
FIG. 1 is a vertical sectional view showing the principal part of a conventional CCD delay element.
Figure 2:
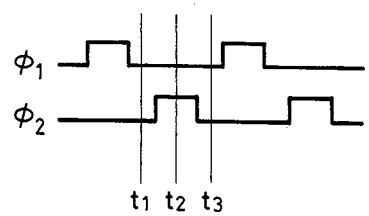
FIGS. 2 and 3 are graphic illustrations of the operation of the CCD delay element of FIG. 1 in terms of clock signals and surface potential.
Figure 3:
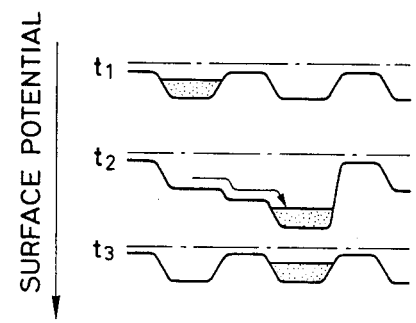

The operation of the CCD delay element thus constructed will subsequently be described. The two-phase clock signals $\phi_1$ and $\phi_2$ are wave signals shown in FIG. 2 and a surface potential profile produced in each unit cell of the delay stage $x_1$ corresponds to what is shown in FIG. 3.

When it is unnecessary to adjust the delay time $Td_1$ set at the delay stage $x_1$, the transfer gate electrodes $Ch_1$ and $Ch_2$ of the unit cells of the adjusting stage $x_2$ are both locked up at a given potential by a control circuit 13 to provide conduction channels allowing the charges to move from the unit cells of the final stages of the delay stage $x_1$ to the output gate OTG at all times. When a signal being transferred is applied to the input terminal IN while the input and output gates G and OTG are held on, an output signal is sent out of the output terminal OUT after the lapse of the delay time $Td_1$ determined by the periods of the delay stage $x_1$ and the two-phase clock signals $\phi_1$ and $\phi_2$.

When an adjustment is made to lengthen the delay time $T_{d1}$ set by the delay stage $x_1$, the transfer gate electrodes $Ch_1$ and $Ch_2$ of the unit cells of the adjusting stage $x_2$ are properly connected through the control circuit 13 to the signal lines of the two-phase clock signals $\phi_1$ and $\phi_2$ so as to behave like the unit cells of the delay stage $x_1$.

More specifically, the wiring is arranged so that the clock signal $\phi_1$ is applied to the transfer gate electrode $Ch_1$, whereas the transfer gate electrode $Ch_2$ remains locked up at the given potential to provide a channel for use in simply moving the charges. Consequently, a time delay $\Delta \tau_1$ caused by the clock signal $\phi_1$ applied to the transfer gate electrode $Ch_1$ is obtained and the delay time can be lengthened up to $Td1 + \Delta \tau_1$.

On the other hand, the transfer gate electrode $Ch_1$ is locked up at the given potential to cause the formation of a channel for use in simply moving the charges, whereas the wiring is arranged so that the clock signal $\phi_1$ is applied to the transfer gate electrode $Ch_2$, thereby obtaining a time delay $\Delta \tau_2$ caused by the clock signal $\phi_1$ applied to the transfer gate electrode $Ch_2$. The delay time can thus be lengthened up to $Td1 + \Delta \tau_2$.

Moreover, provided wiring is arranged so that the clock signal $\phi_1$ is applied to the transfer gate electrode $Ch_1$ and the clock signal $\phi_2$ is applied to the transfer gate electrode $Ch_2$, the time delay $\Delta \tau_1$ caused by the unit cell to which the clock signal $\phi_1$ is combined with the time delay $\Delta \tau_3$ caused by the unit cell to which the clock signal $\phi_1$ is applied. Thereby the delay time can be set at $Td_1 + \Delta \tau_1 + \Delta \tau_3$.

In this case, importance should be attached to the connection of the transfer gate electrodes $Ch_1$ and $Ch_2$ to the particular signal lines of the two-phase clock signals $\phi_1$ and $\phi_2$ in such a manner that the arrangement of the unit cells of the adjusting stage $x_2$ to which the two-phase signals $\phi_1$ and $\phi_2$ are applied should be equal to that of the unit cells of the delay stage $x_1$.

Although a description has been given of this embodiment which only increases the delay time, the wiring may be prearranged as a modified embodiment, for instance, so that the clock signal $\phi_1$ is applied to the transfer gate electrode $Ch_1$ of FIG. 3 to make available delay time $T'd_1$ as a reference. Then, the transfer gate electrode $Ch_1$ may connected to the given potential and separated from the signal line of the clock signal $\phi_1$ to this provide a channel for simply allowing charges to pass. An arrangement for shortening the delay time can thus become possible.

Although the adjusting stage $x_2$ is installed in the final stage on the output terminal OUT side in the embodiment of FIG. 4, moreover, the present invention is not limited to the aforesaid arrangement and the adjusting stage $x_2$ may be provided next to the input gate G or in the middle of the delay stage $x_1$. It is not always required to provide only one adjusting stag $x_2$, which may be dispersedly formed in the midst of the delay stage $x_1$. In this case, however, the unit cells of the delay and adjusting stages, to which the two-phase clock signals $\phi_1$ and $\phi_2$ are applied should be arranged alternately in the transfer direction.

FIG. 5 is a vertical sectional view of the principal part another CCD delay element of a four-phase clock transfer type embodying the present invention.

With respect to the construction of such a delay element, four transfer gate electrodes $a_1$, $a_2$, $a_3$ and $a_4$ as a group constitute a unit cell and are formed on a $p^-$-type silicon substrate 9. A plurality of such unit cells are disposed in series in the transfer direction to form a delay stage $y_1$ of use in producing a reference delay time $Td_2$. Clock signals $\phi_1$, $\phi_2$, $\phi_3$ and $\phi_4$ are applied to the first, second, third and fourth transfer gates $a_1$, $a_2$, $a_3$, $a_4$ of the unit cells, respectively.

In addition to the delay stage $y_1$, an adjusting stage $y_2$ consisting of four transfer gates $\phi_A-\phi_d$ having the same configuration as these of the unit cells of the delay stage $y_1$ is formed.

An input diode 10 and an output diode 11, which are composed of a $p^{+-}$-type region, are formed at the ends of the delay stage $y_1$ and the adjusting stage $y_2$ with an intermediate input gate G and an intermediate output gate OTG. The diode 10 is connected to an input terminal IN and the diode 11 to an output terminal OUT.

Since the operation of such a CCD delay element thus constructed by means of the four-phase clock signals $\phi_1-\phi_4$ is conventionally well known, the description thereof will be omitted. Instead, the adjustment of the delay time mainly embodying the present invention will be described.

First, the transfer gate electrodes $\phi_A-\phi_d$ of the adjusting stage $y_2$ are locked up at a given potential by a control circuit to provide channels allowing the charges to move across the delay stage $y_1$ and the output gate OTG. When a signal is applied to the input terminal IN while the input and output gates G and OTG are held on, an output signal is sent out of the output terminal OUT after the lapse of the delay time $Td_2$ determined by the delay stage $y_1$ and the four-phase clock signals $\phi_1-\phi_4$.

A time delay $\Delta \tau_4$ due to the transfer operation of the adjusting stage $y_2$ is obtained, provided wiring is arranged so that the control circuit applies the clock signals $\phi_1-\phi_4$ to the transfer gate electrodes $\phi_A-\phi_D$ of the adjusting stage $y_2$ in the same order to the electrode $a_1-a_4$ of the unit cells of the delay stage $y_1$. The delay time can thereby be lengthened up to $Td_{2+\Delta \tau_4}$.

As in the case of the first embodiment of FIG. 4 the adjusting stage $y_2$ in this embodiment may also be provided in any proper portion of the delays stage $y_1$ and needless to say a plurality of unit cells may be installed in the adjusting stage $y_2$.

As set forth above, the delay time can be made adjustable without adjusting the period of the clock signal produced by the clock oscillator. The delay stage is formed to a preset reference delay time. The prearranged series adjusting stage has at least more than one unit cell having the same configuration as that of the unit cells constituting the delay stage.

If the aforesaid adjustment is made when characteristic tests are carried out during the process of manufacture under the semiconductor IC technology, production cost and time are reduced because any other process other than that of altering wiring pattern design can ultimately be dispensed with to obtain optimum delay time. Moreover, each transfer gate electrode of the adjusting stage may be connected to a particular bonding pad on the integrated circuit of the CCD delay element to control the adjusting stage from the outside rather than through a control circuit.

Further, the present invention is applicable to not only the two-and four-phase clock transfer type CCD delay elements but also three-phase and other types of CCD delay elements by forming a unit cell having the same configuration as that of each unit cell as for the adjusting stage.

In the CCD delay element thus constructed according to the present invention, at least more than one series additional unit cell for use as an adjusting stage is provided in a proper position where a group of unit cells are formed in the transfer direction. The delay time is lengthened by applying a transfer signal to the adjusting stage so as to make the adjusting stage perform a time delaying transfer operation, whereas the transfer gate electrode of the adjusting stage is locked up at a given potential to provide a channel for use as the flow passage of charges to shorten the delay time, whereby an increase and decrease in the delay time can readily be adjusted.

We claim:

1. A CCD delay element, comprising:
   a delay stage of a plurality of charge-coupled-device unit cells arranged in a transfer direction;
   an adjusting stage of at least one charge-coupled-device unit cell of a same configuration as those of said delay stage and arranged in series with said unit cells of said delay stage;
   clocking means for applying clocking signals to said unit cells of said delay stage to transfer data signals along said transfer direction; and
   selective means for selectively applying at least one of said clocking signals and a predetermined locking potential to said unit cell of said adjusting stage, said locking potential applied to said unit cell of said adjusting stage causing said unit cell of said adjusting stage to be a conduction channel to transfer said data signals thereacross without delay, said one of said clocking signals applied to said unit cell of said adjusting stage to transfer said data signals thereacross with a delay determined by a period of said clocking signals, whereby said data signals are transferred across said delay stage and said adjusting stage with a selective delay.

2. A CCD delay element as recited in claim 1, wherein said selective means is an electronic circuit.

3. A CCD delay element as recited in claim 1, wherein said selective means includes lead wires connected to selected bonding pads of an integrated circuit including said delay stage, said adjusting stage and said clocking means.

4. A CCD delay element as recited in claim 1, wherein said adjusting stage includes at least two of said charge-coupled-device unit cells and said selective means selectively applies in any combination said clocking signals and said locking potential to said at least two unit cells.

* * * * *